(12) United States Patent
Thompson, III et al.

(10) Patent No.: US 7,746,885 B2
(45) Date of Patent: Jun. 29, 2010

(54) TOWER DISCOVERY AND FAILOVER

(75) Inventors: R. Donald Thompson, III, Mercer Island, WA (US); Cosmin A. Corbea, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 933 days.

(21) Appl. No.: 11/372,440

(22) Filed: Mar. 9, 2006

(65) Prior Publication Data
US 2007/0058678 A1 Mar. 15, 2007

Related U.S. Application Data

(62) Division of application No. 10/317,737, filed on Dec. 11, 2002, now Pat. No. 7,043,214.

(51) Int. Cl.
*H04J 4/00* (2006.01)

(52) U.S. Cl. .................................... 370/436; 455/403

(58) Field of Classification Search ................ 370/436; 455/403, 422.1, 436, 442
See application file for complete search history.

(56) References Cited

U.S. PATENT DOCUMENTS

| | | | | |
|---|---|---|---|---|
| 5,263,050 A * | 11/1993 | Sutterlin et al. | ............. | 375/142 |
| 5,799,010 A * | 8/1998 | Lomp et al. | ................... | 370/335 |
| 6,097,954 A * | 8/2000 | Kumar et al. | ................ | 455/442 |
| 6,937,640 B2 * | 8/2005 | Yun et al. | .................... | 375/141 |
| 7,430,197 B1 * | 9/2008 | Uhlik | ......................... | 370/347 |
| 2002/0019228 A1 * | 2/2002 | McKenna et al. | ........... | 455/435 |
| 2002/0049049 A1 * | 4/2002 | Sandahl et al. | .............. | 455/414 |
| 2004/0013133 A1 * | 1/2004 | Fimoff et al. | ................ | 370/473 |

* cited by examiner

*Primary Examiner*—Chi H Pham
*Assistant Examiner*—Fan Ng
(74) *Attorney, Agent, or Firm*—Merchant & Gould, P.C.

(57) ABSTRACT

Described is a communication system including wireless client devices. In the described system, the client devices may be wrist-worn watches such as are in common use today, except that the watches are specially configured to receive transmissions from broadcast towers. A client device is associated with one or more home service regions, and is configured to receive personal messages on a home channel when in the home service region. The client device employs a self-assignment method to identify and select a home channel without the need for interaction by a user. A tower discovery method is employed to identify broadcast towers and available channels within a service region. A failover method is employed to identify a change in the broadcast system, and take appropriate action such as, for example, changing to another broadcast tower, selecting another frequency, selecting a sleep mode, as well as others.

16 Claims, 9 Drawing Sheets

TOWER DISCOVERY AND FAILOVER

This patent application is a divisional application of U.S. patent application Ser. No. 10/317,737, filed on Dec. 11, 2002 now U.S. Pat. No. 7,043,214, entitled "TOWER DISCOVERY AND FAILOVER", which application is hereby incorporated by reference.

FIELD OF THE INVENTION

The present invention relates generally to broadcast systems. More particularly, the present invention relates to a system and method for discovering broadcast towers within a service region, and automatically selecting a tower within the service region.

BACKGROUND OF THE INVENTION

As society becomes increasingly mobile, mobile computing devices are enjoying a tidal wave of popularity and growth. Cell phones, wireless PDAs, wireless laptops and other mobile communication devices are making impressive inroads with mainstream customers. Constraining this growth and limiting customer satisfaction, however, is the lack of a truly adequate high-coverage-area, inexpensive, small, battery-efficient wireless communication system. Cellular data-transmit telephony-based solutions are far from power-efficient, and impose (relative) cost and size burdens that make them unusable. Likewise, other attempts to solve these problems have proved equally unsuitable. For instance, a few entities have attempted to make use of mobile devices that receive information over Frequency Modulated (FM) subcarriers. FM subcarriers (also known as "SCA" for Subsidiary Communications Authorization) utilize the available frequencies above FM stereo within the available modulation bandwidth of an FM station. Subcarriers are typically leased by radio stations, subject to FCC or other national regulation.

Some examples of FM subcarrier systems include the QUOTREK system owned and maintained by the Data Broadcast Corporation (DBC) to deliver stock price quotes to a handheld mobile device. However, the QUOTREK system is a single purpose system limited to receiving stock quotes. The system has various other limitations that make it unusable as a mobile computing device. Likewise, the Seiko Corporation implemented an FM subcarrier system wherein short messages were transmitted to a wrist-worn device. However, the hardware and communications scheme used were relatively primitive, resulting in a need for excessive redundancy in message transmission. These and other shortcomings rendered the Seiko system less than acceptable. Similarly, certain paging systems are based on FM subcarrier use, such as the Radio Data System (RDS) or Mobile Broadcasting System (MBS) systems. However, those systems involve short messages transmitted in a broadcast fashion with limited data rates. Unfortunately, an acceptable mobile device solution has eluded those skilled in the art.

Cellular telephones technologies communicate with a wireless network that is arranged as cells in a grid. Communication with the wireless network and the cellular telephone are established when the power to the cellular telephone is initially applied. The cellular telephone will attempt to locate the closest communication tower using criteria such as signal strength and triangulation techniques. Cellular telephones initially operate at a fixed frequency while communications are established with the network. The cellular telephone will attempt to locate the closest communication tower using criteria such as signal strength and triangulation techniques.

SUMMARY OF THE INVENTION

The present invention is related to a communication system including wireless client devices. In the described system, the client devices may be wrist-worn watches such as are in common use today, except that the watches are specially configured to receive transmissions from broadcast towers. A client device is associated with one or more home service regions, and is configured to receive personal messages on a home channel when in the home service region. The client device employs a self-assignment method to identify and select a home channel without the need for interaction by a user. A tower discovery method is employed to identify broadcast towers and available channels within a service region. A failover method is employed to identify a change in the broadcast system, and take appropriate action such as, for example, changing to another broadcast tower, selecting another frequency, selecting a sleep mode, as well as others.

These and various other features and advantages, which characterize the present invention, will be apparent from a reading of the following detailed description in conjunction with the associated drawings.

DETAILED DESCRIPTION OF THE PREFERRED EMBODIMENT

The present invention is described in the context of a communication system that includes wireless client devices. In the described embodiments, the client devices may be watch type devices that are specially configured to receive communication signals, as is described in greater detail below. As will become apparent from a reading of the following detailed description, the client devices establish a communication link with a broadcast tower through a tower discovery process that includes a failover procedure. Minor deviations from the described embodiments will also become apparent without departing from the spirit of the invention.

Although described here in the context of a watch-based system, it will be apparent that the teachings of the application have equal applicability to any other mobile or non-mobile devices, such as portable and desktop computers, personal digital assistants (PDAs), cellular telephones, and the like. The use of a watch is for illustrative purposes only to simplify the following discussion, and may be used interchangeably with "mobile device."

The overall operating environment for the tower discovery and failover system will be discussed as follows below with reference to FIG. 1.

Operating Environment

Figure 1:
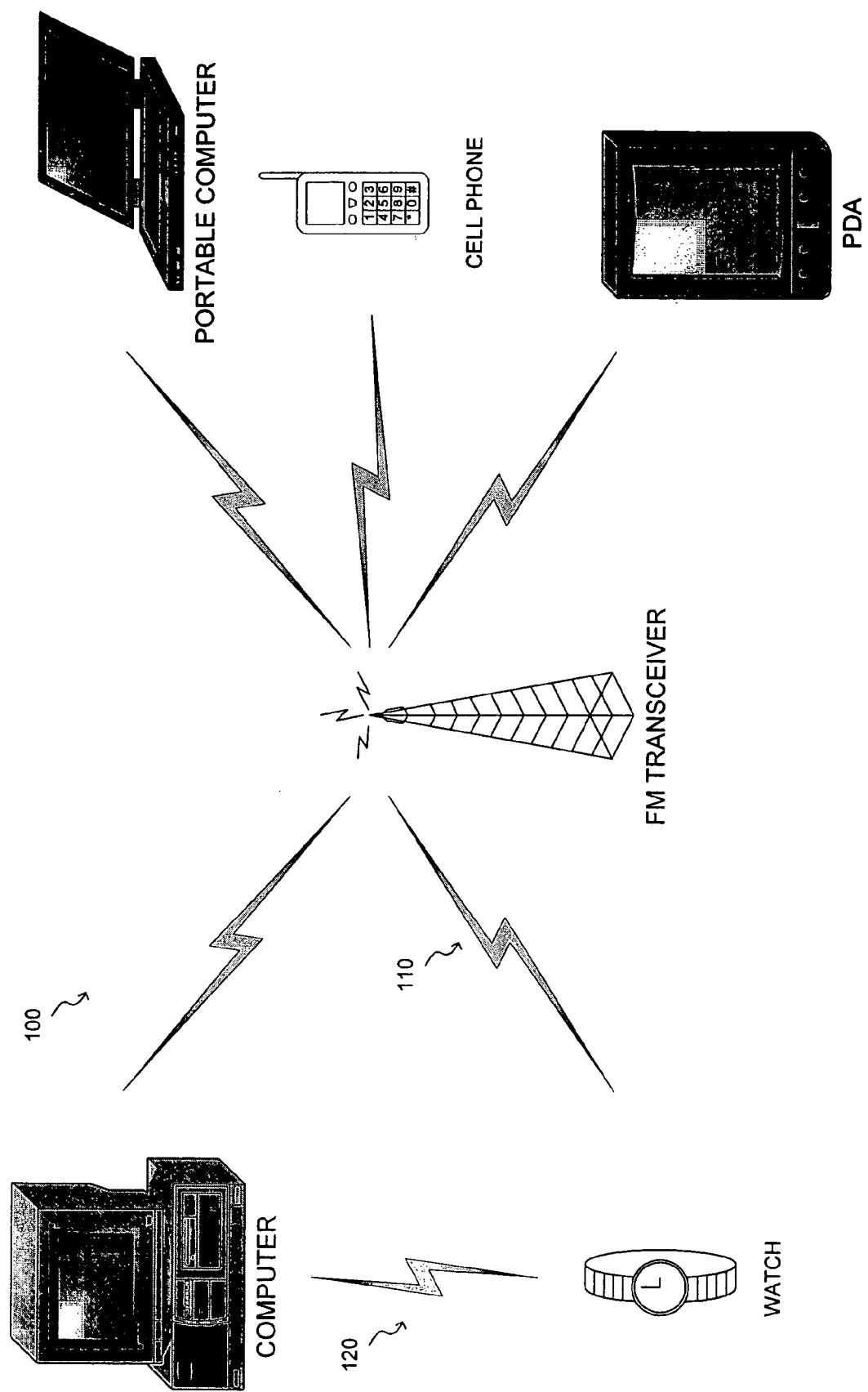
FIG. 1 is a diagram illustrating an exemplary operating environment.

FIG. 1 illustrates an exemplary operating environment (100) for the present invention. As illustrated in the figure, an FM transceiver or broadcast is transmitted over a communication channel (110) to various electronic devices. Example electronic devices that have an FM receiver or transceiver may include a desktop computer, a watch, a portable computer, a wireless cellular telephone (cell phone), and a personal data assistant (PDA). The electronic devices are arranged to receive information from the FM broadcast. The FM broadcast may be of any number of types including but not limited to: a standard FM transmission, a sub-carrier FM transmission, or any other type of FM transmission as may be desired.

FM sub-carriers are often referred to as an SCA as identified by the Federal Communications Committee (FCC) term for the Subsidiary Communications Authorization. An FM sub-carrier utilizes bandwidth that is otherwise unused in the FM stereo-band about an FM station. In the United States of America the FCC requires the modulation bandwidth to be roughly from 53 KHz to 100 KHz within the modulation bandwidth of the FM station.

Figure 2:
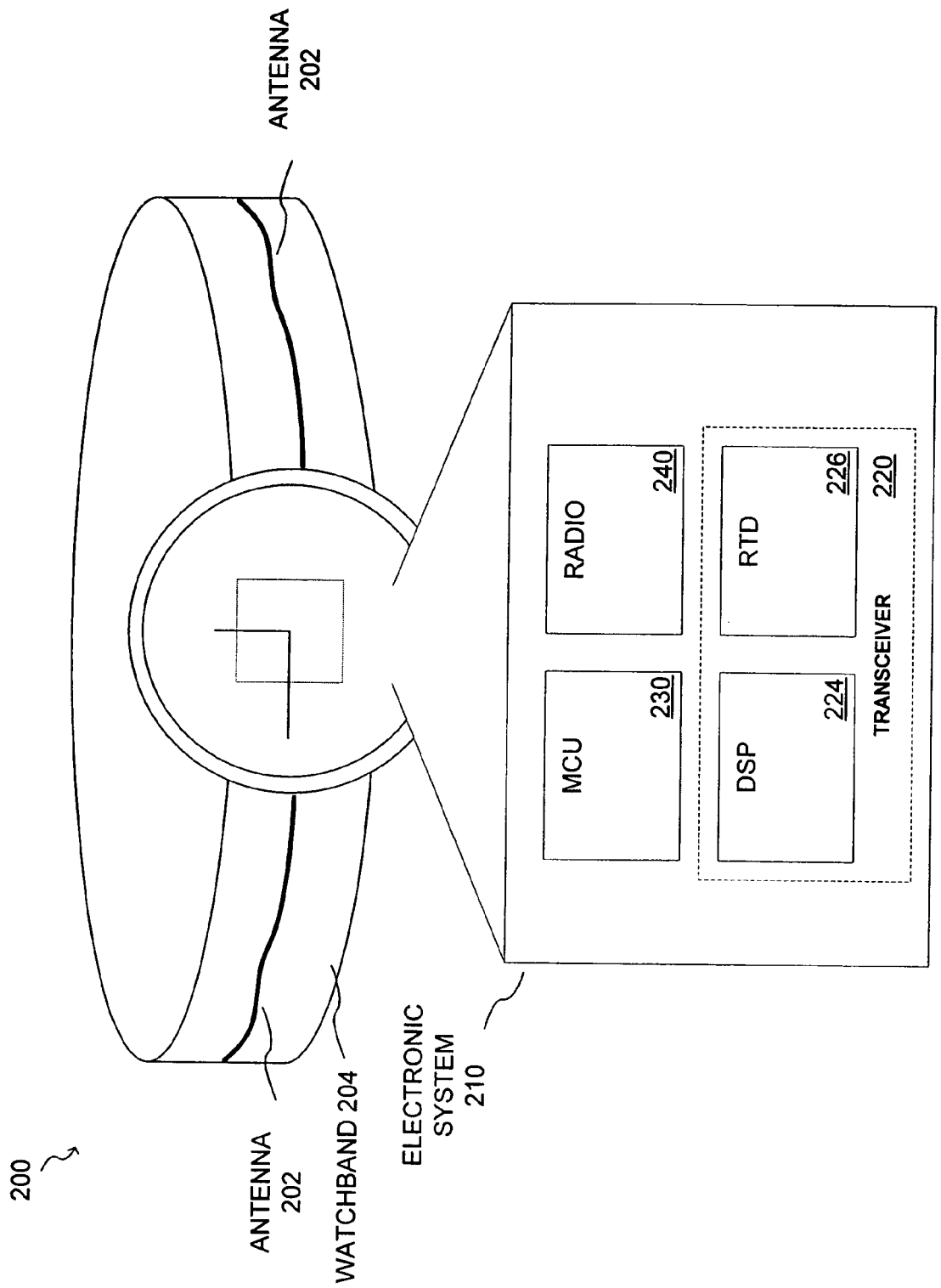
FIG. 2 is a diagram illustrating an implementation of the invention in a wireless client device, such as a wrist-worn mobile device.

FIG. 2 illustrates an exemplary watch device (200) that includes an electronic system (210) that is configured to operate in accordance with the present invention. The watch device (200) includes a watchband (204) that includes an antenna that is either attached to the watchband or integrally formed within the watchband. The antenna is coupled to the electronic system (210) that is contained in the watch. The electronic system may be contained in the bezel as shown in FIG. 2, or in some other portion of the watch device (not shown).

The electronic system (210) is arranged to operate as either a receiver or transceiver type of device. As illustrated in the figure, the electronic system includes a transceiver (220), a microcomputer unit (MCU 230), and an analog radio (240). The antenna connects to, and is controlled by, the transceiver (220). Transactions between the MCU (230) and the radio components are mediated over a MCU-digital transceiver interface. The components of the watch device (200) are housed in a watch-sized enclosure and rely on battery power for operation.

The transceiver (220) generally includes a digital signal processor (DSP 224), which performs control, scheduling, and post-processing tasks for the transceiver, and a real time device (RTD 226), which includes a digital radio, system timing, and real-time event dispatching. The DSP (224) is coupled to the MCU (230), and transceiver tasks are commanded by the MCU (230).

One of the DSP's tasks may be to process received data for such purposes as subcarrier phase recovery, baud recovery and/or tracking, compensation for fading effects, demodulation, de-interleaving, channel state estimation and error-correction. The post-processing of packets may occur when an entire packet has been received, or another subsequent time. The DSP (224) analyzes the transmitted data packets to determine the station's signal timing with respect to the local clock of the RTD (226). The local clock is synchronized with the transmitter's clock signal to maintain signal sampling integrity. The receiver is periodically brought into symbol synchronization with the transmitter to minimize misreading of the received data.

The digital section of the RTD (226) may include system time-base generators, such as a crystal oscillator that provides the system clock for the MCU (230) and the DSP (224). The time-base also provides baud and sample timing for transmit and receive operations, start/stop control for radio operation, and controls the periods of clock suspension to the MCU (230) and the DSP (224). The RTD (226) also performs radio operations, and may perform additional operations as well. The radio (240) is arranged to receive segments of data that is arranged in packets.

The operating environment shown in FIG. 2 is only one example of a suitable operating environment and is not intended to suggest any limitation as to the scope of use or functionality of the invention. Other well known computing systems, environments, and/or configurations that may be suitable for use with the invention include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like.

Wireless Service Regions

Each wireless client device is configured to operate in at least one service region. A service region is a geographic area that is serviced by one or more broadcast transmitter towers (see FIG. 1). The wireless client device (e.g., see FIG. 2) is assigned to a home frequency, where the device's personal data is broadcast. During initialization of the wireless client device, the wireless client device tunes to an appropriate frequency and begins receiving data. If possible, the device selects the home frequency and receives personal data. Since the wireless client device may be mobile, the service region may change during commuting, traveling, as well as other failover situations as will be described in further detail. Discovery of at least one broadcast tower is required to establish reception in a service region.

Figure 3:
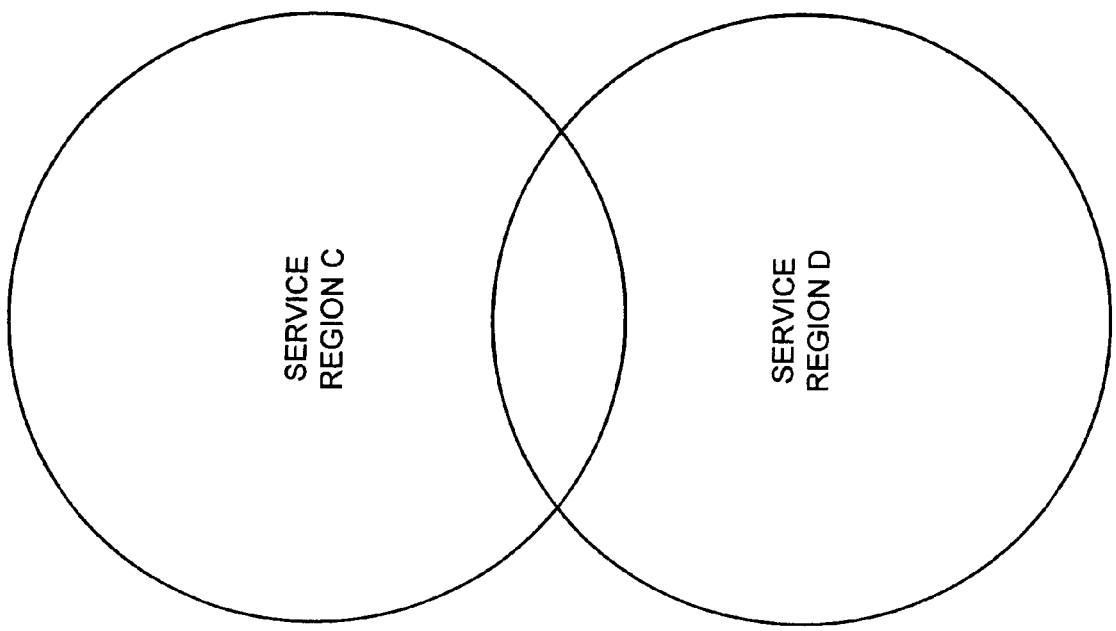
FIG. 3 is a diagram illustrating exemplary service regions.
Figure 3:
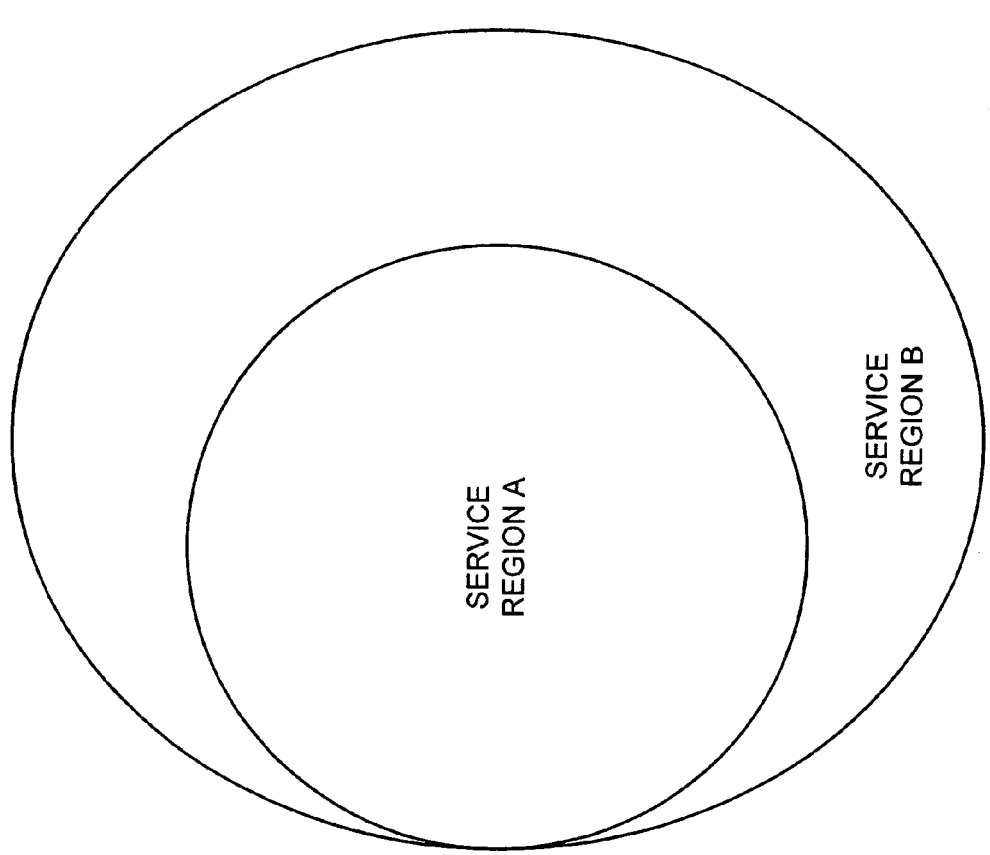

FIG. 3 illustrates exemplary service regions that are related to the present invention. Service regions may be geographically located as separated, overlapping or contained service regions. An example of separated service regions is illustrated by service region A and service region C. An example of overlapping service regions is illustrated by service region C and service region D. An example of contained service regions is illustrated by service region A and service region B.

Each service region includes at least one broadcast transmitter tower. Each broadcast station (broadcast frequency) is considered equally capable of servicing any particular service region such that the least powerful and least well located of all available broadcast frequencies will define the bounds of a service region. When a service region includes multiple broadcast towers, different towers within the service region may not have identical coverage. The service region for multiple broadcast towers is defined as the minimal area for which all towers have adequate coverage. Each wireless client device within a service region is viewed as a client type of device that is capable of receiving the broadcast transmissions from the broadcast towers.

A failover condition occurs when a signal on a particular frequency is no longer operating properly. The number of broadcast towers in a service region may be variable, and a particular broadcast tower may become unavailable. The failover condition may be the result of a broadcast tower going offline unexpectedly, or some other failure condition.

Broadcast Services

Figure 4:
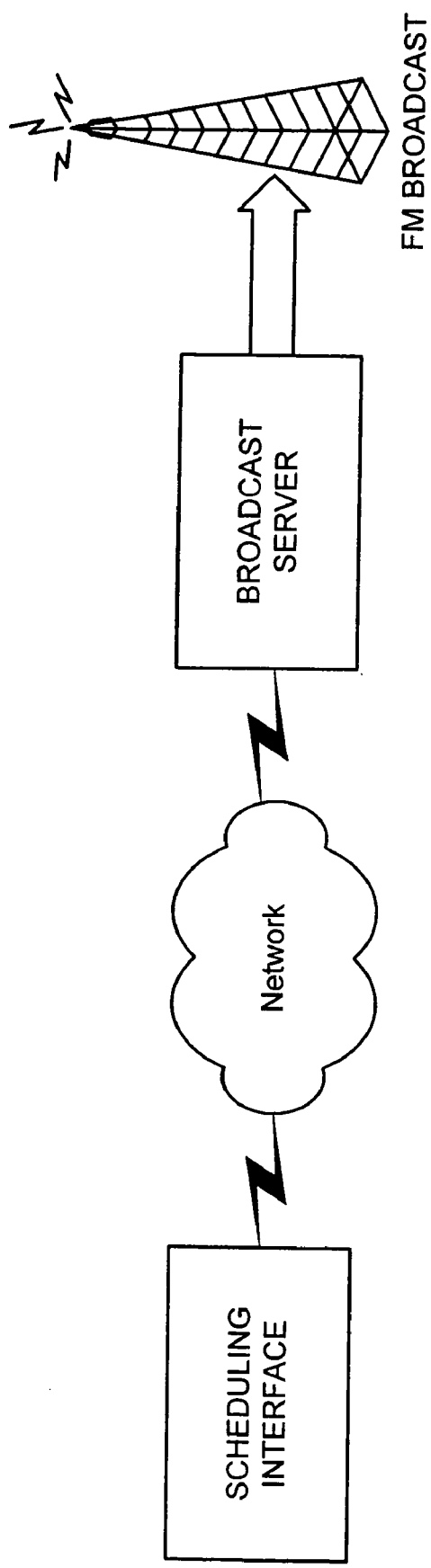
FIG. 4 is a block diagram of an exemplary broadcast and scheduling system.

In accordance with the present invention, each broadcast transmitter tower is arranged to provide a communication signal that is configured for reception by wireless client devices within a service region. As shown in FIG. 4, an exemplary FM broadcast tower transmits signal as directed by a broadcast server device. The broadcast server device may communicate with a scheduling interface via a network communication link.

The scheduling interface is configured as a means for selecting one or more services. In one example, a wireless client device user interacts with the scheduling interface to select services such as news, stock prices, weather, and other features such as a personal calendar, address book, and the like. Selected services are entered in a database for broadcast transmission at a later time. At the designated time (or time interval) the scheduling interface communicates with the broadcast server to begin a transmission sequence of data for the selected services. The broadcast server subsequently formats the data for reception by one or more wireless client device, queues the data for transmission, and communicates the queued data to the FM broadcast tower for transmission. In an alternative example, the scheduling interface communicates the selected services to the broadcast server. The broadcast server schedules the time interval for transmission of the selected service.

Each broadcast transmission corresponds to the transmission of one or more frames. Each frame is organized with at least one header and a message payload that includes the content for one or more selected services as previously described. The message payload may correspond to global messages or personal messages. Every client device that is located within the designated service region may receive global messages, while a single client device may decode a personal message.

The header includes a service region identifier and a list of available stations for the identified service region. Control information may also be included in one of the headers to indicate broadcast conditions such as a change in available channels, an assignment of a service region to a particular wireless client device, and an assignment of a particular channel (frequency). In one example, each frame includes a change counter in one of the headers to indicate a change has taken place in the system. Wireless client devices (clients) may use the change counter to determine when to initiate failover.

Figure 5:
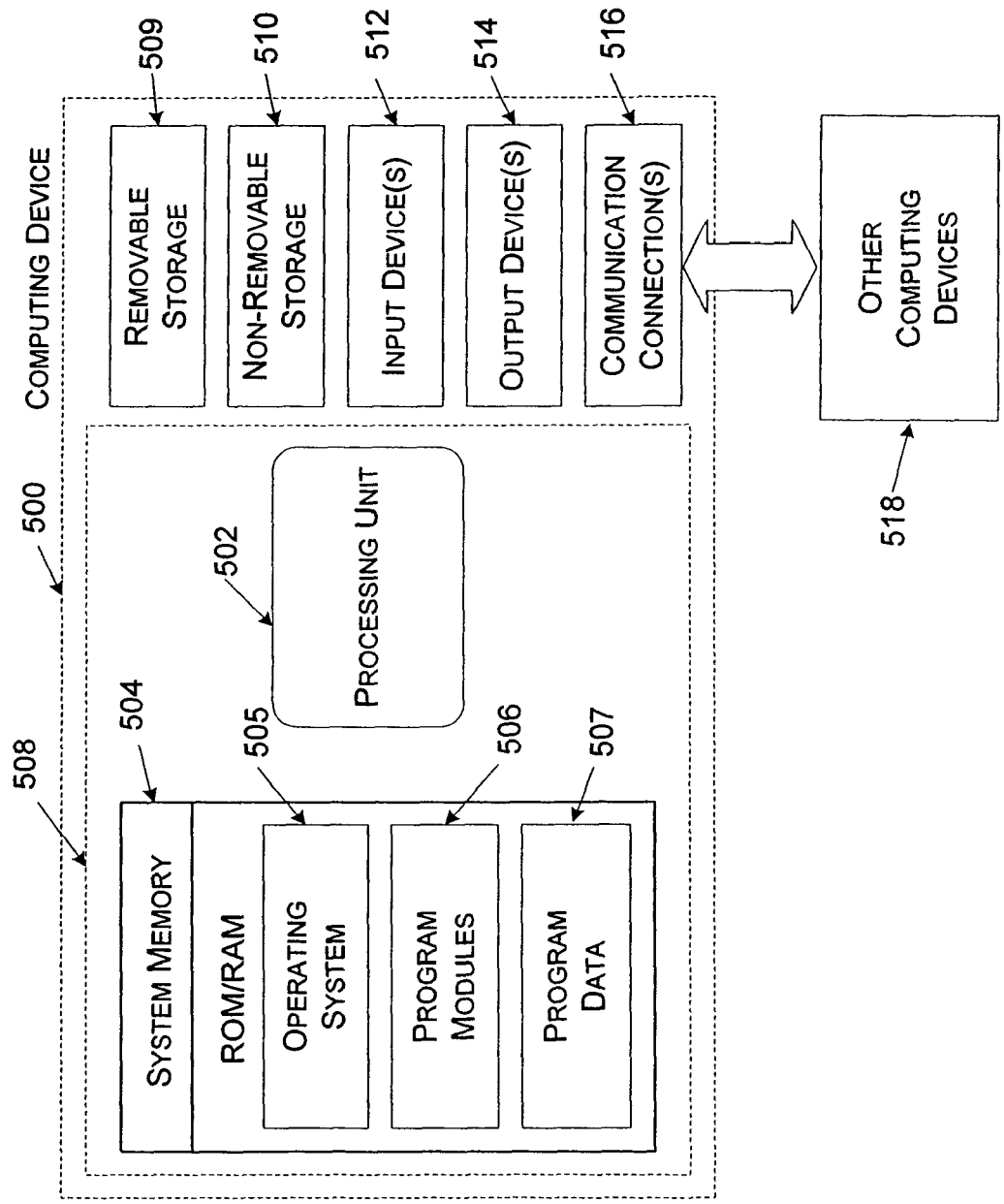
FIG. 5 is a block diagram of an exemplary computing device.

An exemplary scheduling interface may be implemented as a computing device. Also, the broadcast server may be implemented as a computing device. An exemplary computing device (500) is illustrated in FIG. 5.

In a basic configuration, computing device 500 typically includes at least one processing unit 502 and system memory 504. Depending on the exact configuration and type of computing device, system memory 504 may be volatile (such as RAM), non-volatile (such as ROM, flash memory, etc.) or some combination of the two. System memory 504 typically includes operating system 505, one or more program modules 506, and may include program data 507. This basic configuration is illustrated in FIG. 5 by those components within dashed line 508.

Computing device 500 may also have additional features or functionality. For example, computing device 500 may also include additional data storage devices (removable and/or non-removable) such as, for example, magnetic disks, optical disks, or tape. Such additional storage is illustrated in FIG. 5 by removable storage 509 and non-removable storage 510. Computer storage media may include volatile and non-volatile, removable and non-removable media implemented in any method or technology for storage of information, such as computer readable instructions, data structures, program modules or other data. System memory 504, removable storage 509 and non-removable storage 510 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 500. Any such computer storage media may be part of device 500. Computing device 500 may also have input device(s) 512 such as keyboard, mouse, pen, voice input device, touch input device, etc. Output device(s) 514 such as a display, speakers, printer, etc. may also be included. All these devices are known in the art and need not be discussed at length here.

Computing device 500 also contains communications connection(s) 516 that allow the device to communicate with other computing devices 518, such as over a network. Communications connection(s) 516 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, microwave, satellite, infrared and other wireless media. The term computer readable media as used herein includes both storage media and communication media.

Broadcast Channel Self-Assignment

Wireless client devices may not have a transmitter that is capable of communicating with the broadcast system servers. For example, a watch device may have receiver capabilities without any transmitter capability. Clients (wireless devices) of the broadcast system are presumed to have no transmitter capability such that channel (broadcast frequency) selection for personal messages must be arrived at through another mechanism.

A home frequency corresponds to a particular broadcast channel for which the client device must be tuned in order to receive personal messages. The server device and the client device select the same broadcast channel without any direct communication. Homing is the process by which the client device and the server device arrive at a shared understanding of the selected broadcast channel for communicating personal messages. The selection criteria for a home station (home broadcast channel) is regionally based on criteria such as signal reliability, load balancing and scaling. A home service region is assigned to a client device during activation. The user selects the home service region based on a zip code, area code, or some other regional indicator through a scheduling interface (see FIG. 4) such as a website based sign-up. The scheduling interface communicates with a server, which determines the assignment of a home service region for the client device.

Once the server assigns a home service region to the client, the assigned home service region is communicated to the client device through a broadcast transmission. The broadcast transmission includes a header that indicates a list of available channels which each corresponds to a particular frequency. The client device performs a sweep of the FM frequencies looking for valid frame data. When a valid frame is received the client reads the header to retrieve a list of towers assigned to the service region. The client device retrieves personal messages from the assigned channel slot numbers, and decrypts the personal messages using a unique code.

The client device computes a unique code (e.g., a 128-bit code) using an encryption string (e.g., "hello world") and a unique control key. A unique identifier that is assigned to the client device (e.g., a serial number) determines the unique control key. In one example, the unique identifier is used as a seed for a code generator such as a seed for a random number generator. Client numbers are generated from the unique code such as tower assignment and private message channel numbers (home station). In one example, the unique identifier corresponds to a unique serial number that is associated with the client device. An exemplary unique code may be a 128-bit code, where 32-bits of the unique code are used as an offset amount to determine tower assignment from the list of available towers in the service region. For example, offset=N modulo n, where N corresponds to the 32-bits from the unique code, and where n is the number of stations that are available in the service region.

The broadcast server is arranged to encode personal messages for transmission to a particular client with a similar method as described above. The broadcast server is aware of the unique control keys for every client device. Each personal message is encoded according to the unique control keys and the unique identifier for the client device. In one example, the broadcast server computes a 128-bit code that is identical to the 128-bit code that is computed by the client device. Auto assignment of the broadcast tower and personal messages channels are determined using the above-described self-assignment procedure.

Homing and Roaming

As described previously, each client device (e.g., see FIG. 2) is assigned to a home frequency, where the device's personal data is broadcast. Discovery of at least one broadcast tower is required to establish reception in a service region.

In one example, the homing procedure is initiated in a geographic area where separate service regions (see FIG. 3) exist. In this example, the broadcast transmission initializes the client device to recognize the home service region and home frequency. After activation, there is no need to reinitialize the home service region unless the user initiates a home service region change through the sign-up processes as previous described above.

In some instances, the client will attempt activation in a geographic location where more than one broadcast service region exists. For example, activation of the client device in an overlapping or contained service region may create an uncertainty about which service region the client will assign to the client device. Directed homing may be employed to override the automatic service region assignment such that the proper service region identifier will be assigned to the client device. Directed homing may be initiated by any appropriate method including: a user initiated key sequence, and broadcasting of control information from the servers on the appropriate transmission towers in the overlapping or contained service regions. Once the client device is assigned to the home service region, the client will ignore received frames from other service regions.

The client device may be configured to restart the homing process (re-homing) when the received signal fades on the home frequency for more than a set number of frames (e.g., 10 frames).

The client device performs a basic homing procedure by searching for a valid signal while sweeping through the available frequency range. During the frequency sweep, the client device receives one or more frames of data. The client device selects the first station in the home service region and retrieves the station list. When the station list is the same then the client device presumes there is a problem with the reception on the home station, temporarily tunes to any station, and checks for the home station in the service region's station list at regular intervals (e.g., 10 minute intervals). The procedure for homing and re-homing will be described in more detail with reference to FIGS. 7-10.

When the home station is no longer found in the service region's station list the client device selects a failover mode. In the failover mode, the client device reselects a home station from the station list employing the self-assignment procedure previously described above. The server device automatically re-routes personal data to the appropriate stations when the home station is removed from the service region station list.

The client device selects a roaming mode when the entire frequency band sweep fails to find a station in the home service region. In roaming mode, the client receives frames from any service region, and temporarily assigns the new service region to the device. The station list is accessed for the new service region and an appropriate station is selected using the self-assignment procedure previously described above.

Discovery and Failover

The number of broadcast towers in a service region may be variable. One or more towers may go off air, while other towers may be brought on air. For example, additional broadcast towers may be necessary to service a larger client base as the number of clients in a service region grows. The self-assignment procedure described above will ensure that clients are equally distributed between broadcast towers, and that the assignment of towers to clients automatically occurs whenever a change in the number of broadcast towers in the service region occurs.

As previously described, each frame may include a change counter (e.g., a 2-bit counter) in one of the headers to indicate a change has taken place in the system. Each client compares the change counter to a locally stored copy (a cached copy). Whenever a change occurs in the system (i.e., a broadcast tower is brought on-line), the change counter is modified. Each client recognizes the change in the change counter and initiates a homing procedure to acquire a new station list, and re-assign the client to the appropriate broadcast tower. The broadcast server (see previous discussion) modifies the change counter without any interaction from the client when a change occurs in the configuration of the broadcast towers. As described previously, the self-assignment procedures accomplish channel and tower assignment without requiring interaction with the client.

Home Service Region Changes

As described previously, each client device (e.g., see FIG. 2) is assigned to a home frequency, where the device's personal data is broadcast. Since the client device may be mobile, the service region may change during commuting, or traveling.

Figure 6:
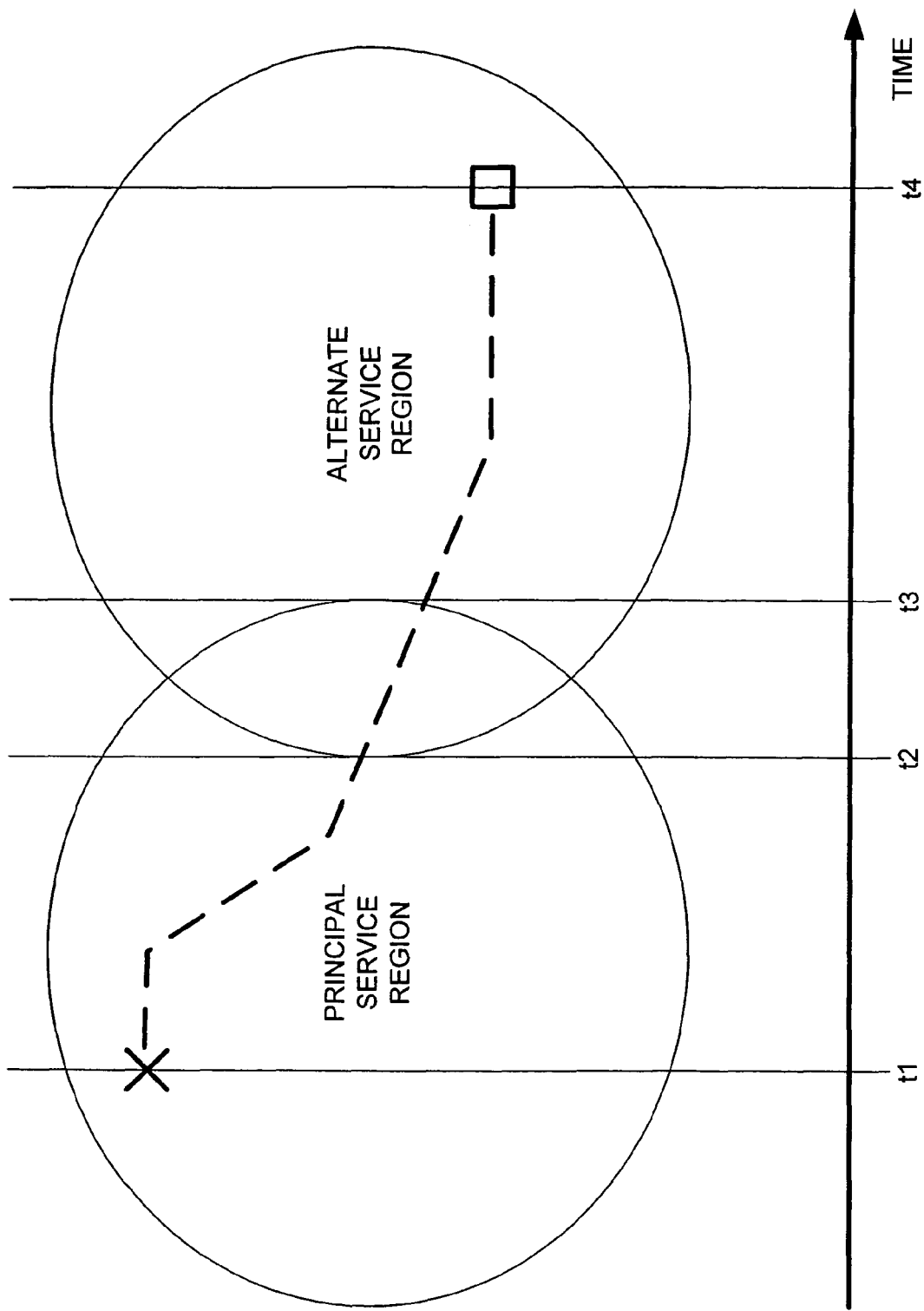
FIG. 6 is a diagram illustrating an exemplary commuting scenario.

A commuting situation is exemplified in FIG. 6. At time t1, the client device is located in a first broadcast service region (e.g., the principal broadcast service region) as designated by an "X" symbol. Between time t1 and t2, the client device is traveling in the first broadcast service region. Between time t2 and t3, the client device is possibly in the first service region and a second service region (e.g., the alternative service region). Between time t3 and t4 the client device is traveling in the second service region. At time t4, the client device arrives at a destination point as designated with a box symbol.

During times t1 through t2, the client device has a home service region corresponding to the first service region. During times t3 through t4 the client device has a home service region corresponding to the second service region. Between times t2 and t3 the client device may be located within either or both service regions. This type of situation may occur when a particular person is a commuter that travels between particular service regions at regular time intervals. Broadcast towers are scheduled to provide selected services and related content over the traveling time intervals through appropriate towers within the service regions. During the time intervals where the client device may be in either service region, broadcast towers in both service regions will attempt to communicate with the client device. In this case, the client device is instructed to receive messages from each service region according to the commuting schedule.

In some instances a client may require multiple home service regions. For example, a client device may be located in a boundary area between two or more service regions, and thus require two or more home service regions to ensure that broadcast transmissions are received. In this case, the client device will select the first service region that it receives and self-assign an appropriate tower in that service region. The broadcast servers will transmit messages for the client device in each of the multiple home service regions.

Procedural Flow

Figure 7:
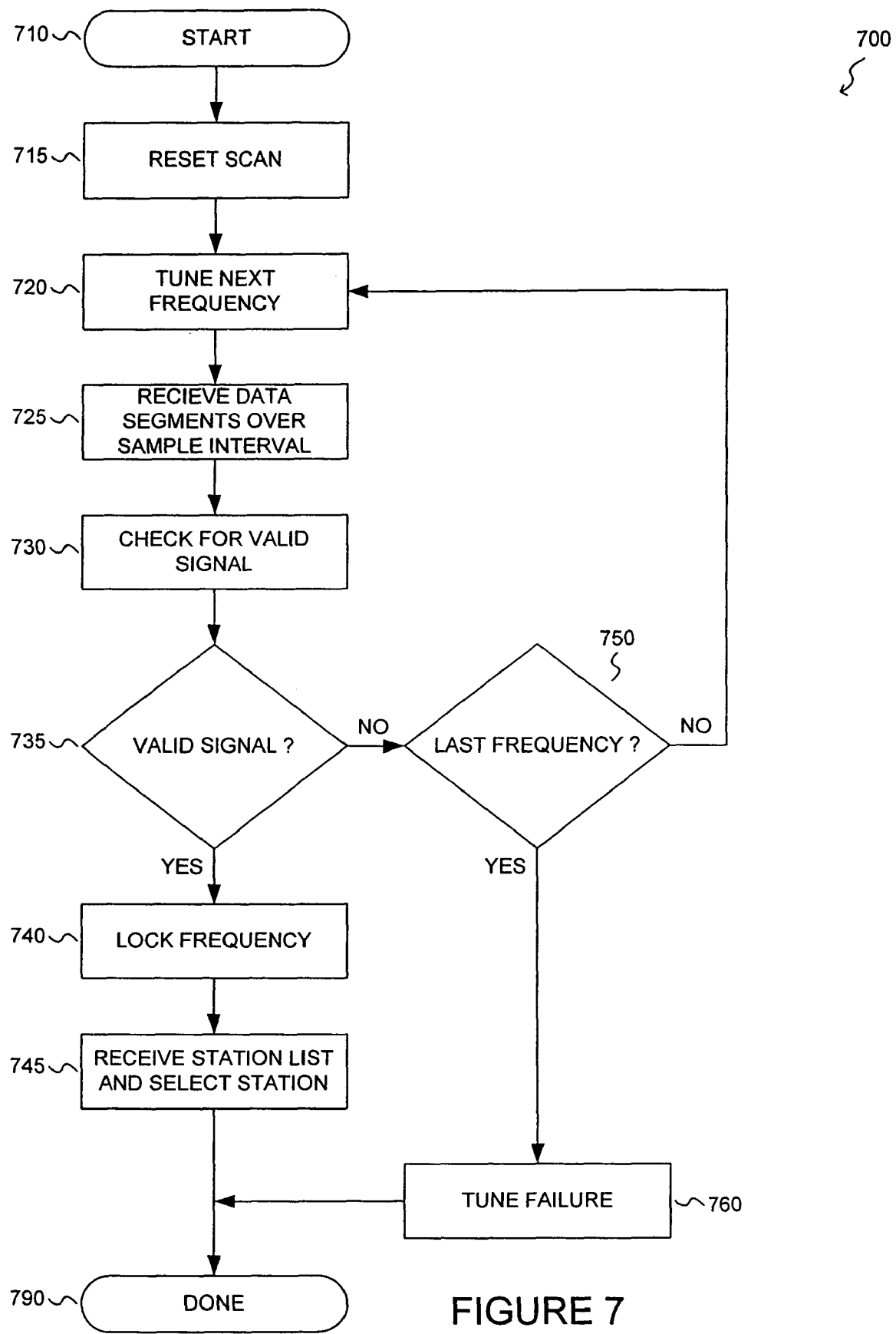
FIGS. 7-9 are exemplary flow charts, arranged in accordance with the present invention.

An example procedural flow (700) for homing/re-homing is illustrated in FIG. 7. Starting at block 710, processing flows to block 715 where the receiver frequency in the client device is reset. Continuing the block 720, the client device is tuned to receive signals at the next available scan frequency. Proceeding to block 725, the client device receives a number of frames at the tuned frequency over a sampling interval. After the end of the sampling interval, the client device analyzes the received frame (or frames) at block 730 to determine if the received frame is valid, and then proceeds to decision block 735. Processing continues from decision block 735 to block 740 when a valid signal is found in the received frame. Alternatively, processing continues from decision block 735 to decision block 750 when the received frame does not include a valid signal.

The current receiver frequency is selected (locked) at block 740. Processing continues from block 740 to block 745, where the station list is extracted from the received frame, and the client device selects the appropriate station based on the self-assignment algorithm previously described.

Processing flows from decision block 750 to block 720 when the last frequency in the frequency sweep has not been reached. At block 720 the next available frequency in the frequency sweep is selected. Alternatively, processing continues from decision block 750 to block 760 when the last frequency is reached and a valid signal has not been found. At block 760 it is determined that a valid receiver frequency was not found and a tune failure procedure may be initiated. Processing is concluded at block 790.

Figure 8:
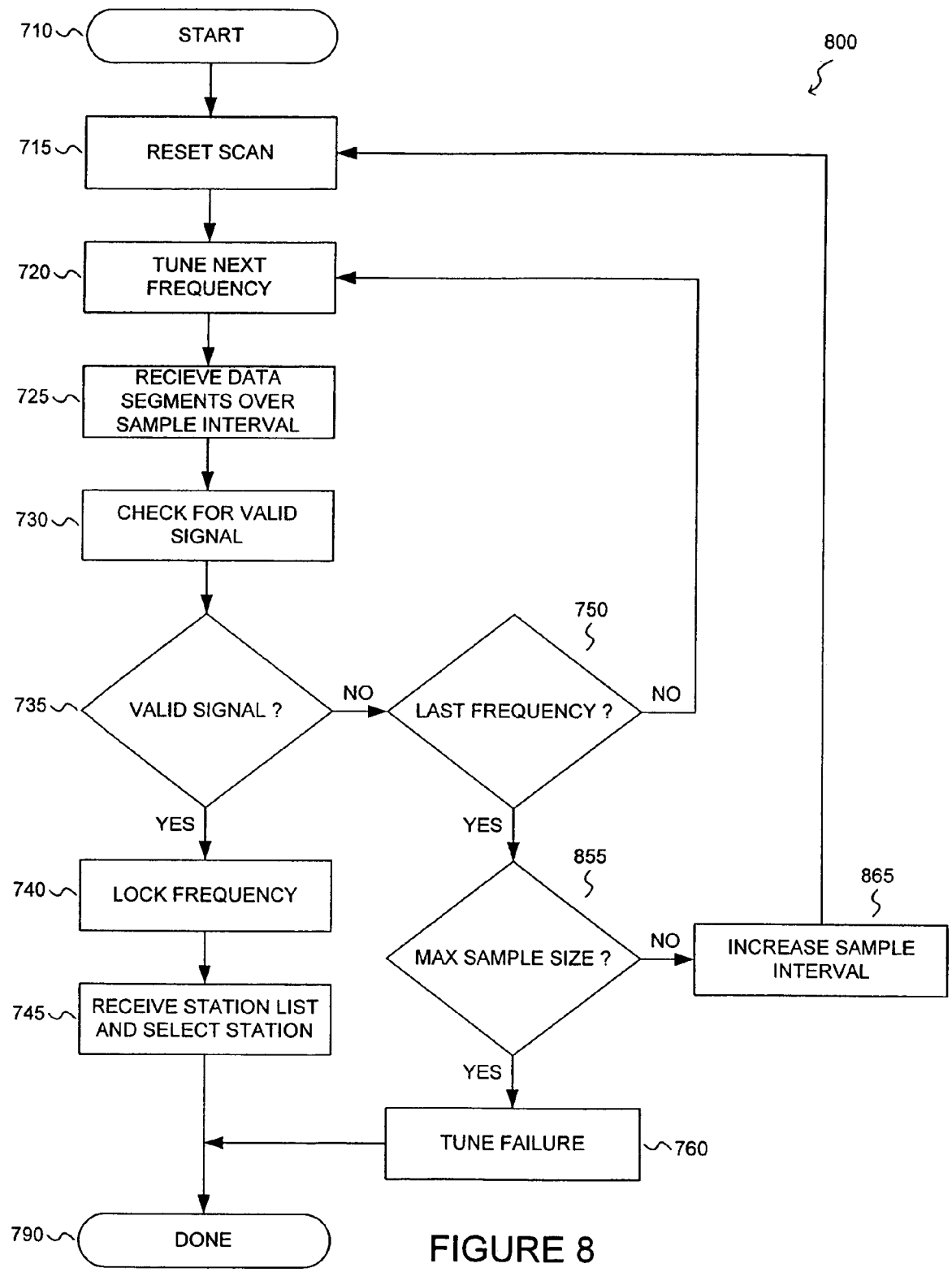

Another example procedural flow (800) for homing/re-homing is illustrated in FIG. 8. Procedural flow 800 is substantially similar to procedural flow 700 described with reference to FIG. 7, and like procedural steps are labeled identically. However, procedural flow 800 includes blocks 855 and 865 as will be described below.

In FIG. 8, processing continues from decision block 750 to decision block 855 when the last frequency in a sweep is achieved. Processing continues from decision block 855 to block 865 when the sample interval size is below a maximum amount. Alternatively, processing continues from decision block 855 to block 760 when the maximum sample interval size is reached and a valid signal has not been found. At block 865 the sample size is increased. Processing flows from block 865 to block 715, where the receiver frequency scan is reset and scanning is performed with the increased sample interval size.

Figure 9:
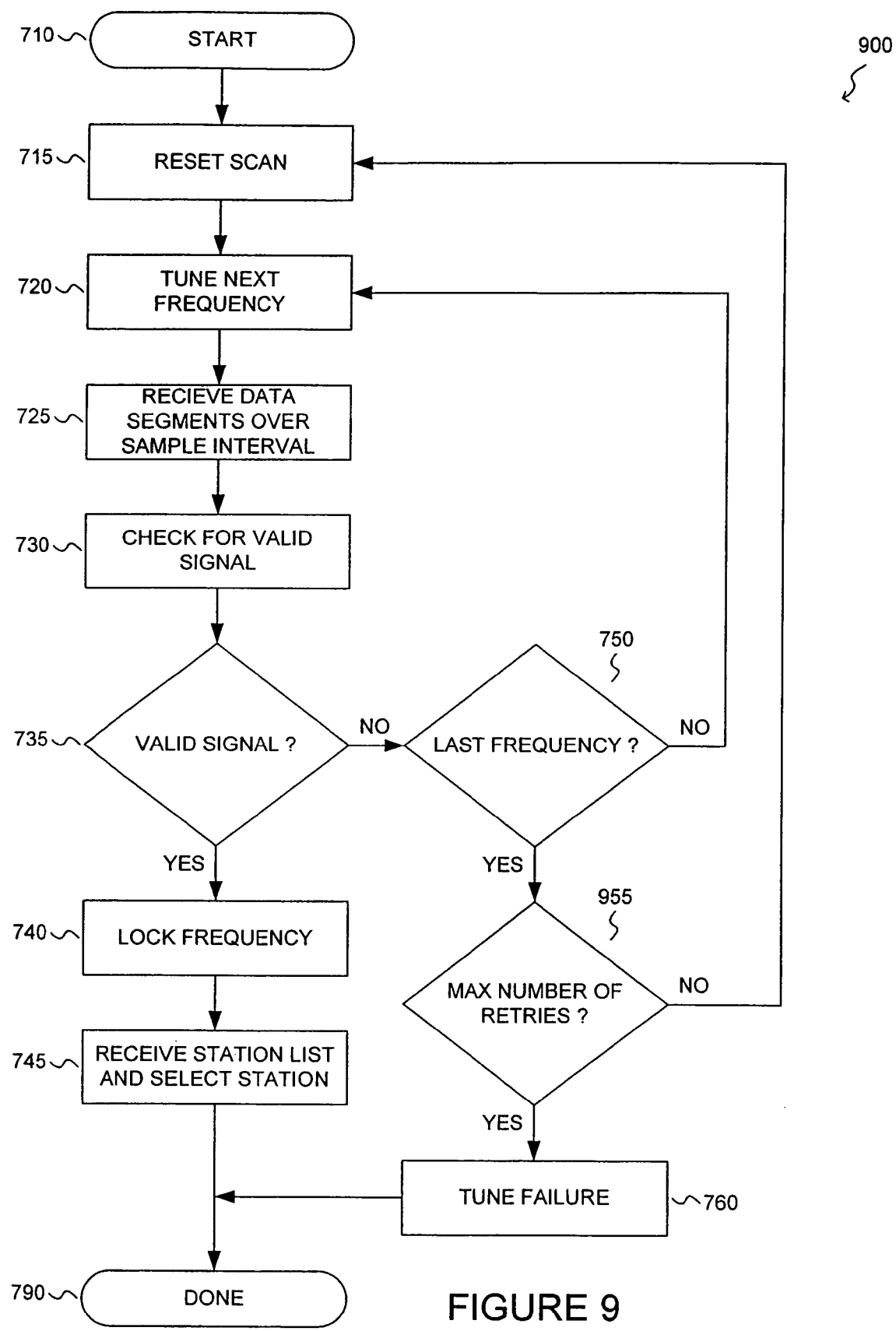

Another example procedural flow (900) for homing/re-homing is illustrated in FIG. 9. Procedural flow 900 is substantially similar to procedural flow 700 described with reference to FIG. 7, and like procedural steps are labeled identically. However, procedural flow 900 includes decision block 955 as will be described below.

In FIG. 9, processing continues from decision block 750 to decision block 955 when the last frequency in a sweep is achieved. Processing continues from decision block 955 to block 715 when the number of retries performed is below a maximum amount. Alternatively, processing continues from decision block 955 to block 760 when the maximum number of retries is reached and a valid signal has not been found.

In one example of the present invention, the frequency sweep range is from 88-108 MHz (the FM broadcast spectrum). The receiver frequency may be increased in 100 kHz increments when the frequency is changed. The frequency sweep may be varied linearly, logarithmically, in predetermined steps, or according to a table of frequencies in the client device. The client device records received signals over the sample interval period. The received signals are analyzed to locate a data sync pattern. The data sync pattern is employed to determine when a valid signal is received. The data sync pattern may be distributed over several segments. When the correlation of the data sync pattern indicates that proper synchronization is achieved (e.g., finding a peak in the correlation of the data sync pattern), then a valid signal is identified. Once the valid signal is achieved the frequency sweep is terminated and the current sweep frequency is locked. After the station list is retrieved, the previously discussed self-assignment procedure is employed to select an appropriate station for receiving personal messages. The client device tunes to the self-assigned station and begins receiving messages.

Although the preceding description describes various embodiments of the system, the invention is not limited to such embodiment, but rather covers all modifications, alternatives, and equivalents that fall within the spirit and scope of the following claims.

We claim:

1. A method utilizing a processing unit for providing communication between broadcast towers and a client device, comprising:

selecting services with a scheduling interface;

scheduling a transmission of message content, wherein the message content corresponds to messages associated with at least one of the selected services;

assembling a frame with a frame header and the message content;

formatting the frame header with a service region identifier, wherein the service region identifier corresponds to a service region for a broadcast tower; encoding control information in at least one frame header, wherein the control information comprises at least one of: a broadcast condition associated with the service region for the broadcast tower, a change in available channels associated with the service region for the broadcast tower, an assignment of a particular channel for a particular client device, an assignment of another particular channel for all client devices, and a change counter that is arranged to indicate when a change has taken place in the system; and transmitting the frame from the broadcast tower at a first scheduled time for reception by the client device;

assembling another frame with another frame header and the message content;

formatting the other frame header with another service region identifier, wherein the other service region identifier corresponds to another service region for another broadcast tower; and transmitting the other frame from the other broadcast tower at a second scheduled time for reception by the client device, whereby the client device receives the message content in the service region and the other service region during a scheduled travel between the service region and the other service region.

2. The method of claim 1, wherein transmitting the frame further comprises transmitting the frame at a specified frequency that is in the range from 88 MHz to 107 MHz.

3. The method of claim 1, wherein transmitting the frame further comprises transmitting the frame according to at least one of: a frequency modulated (FM) transmission, and a sub-carrier based frequency modulated transmission.

4. The method of claim 1, further comprising transmitting the selection of services to a broadcast server.

5. The method of claim 1, wherein the broadcast tower and the other broadcast tower are geographically located in at least one of separated service regions, overlapping service regions, and contained service regions.

6. The method of claim 1, further comprising: encoding a station list in the frame header.

7. The method of claim 6, further comprising: encoding control messages in the frame header.

8. The method of claim 1, further comprising:
computing a unique code, wherein the unique code is associated with the client device;
selecting a personal message channel number in response to the unique code; and
assembling a personal message for the client device on the selected personal message channel.

9. The method of claim 8, further comprising: encoding the personal message according to a unique control key associated with the client device.

10. The method of claim 8, wherein selecting the private message channel number from the unique code comprises: determining a channel number as N modulo n, wherein N corresponds to at least a portion of the unique code, and n corresponds to the number of stations in the service region.

11. The method of claim 10, wherein N corresponds to a 32-bit number from a 128-bit unique code.

12. The method of claim 10, wherein computing the unique code comprises:
selecting a unique identifier that is associated with the client device;
applying the unique identifier to a code generator that provides a resulting code, wherein the unique identifier is a seed to the code generator; and
applying the resulting code to an encryption string to determine the unique code.

13. The method of claim 1, further comprising: encoding a data sync pattern in the frame such that a correlation of the data sync pattern by the client device indicates a valid signal reception by the client device.

14. The method of claim 13, wherein the data sync pattern is encoded in a distributed manner over several segments of the transmission.

15. A system for providing communication between broadcast towers and at least one client device, comprising:
a means for selecting services with a scheduling interface;
a means for scheduling a transmission of a message payload, wherein the message payload is associated with at least one of the selected services;
a means for assembling a transmission frame with a frame header and the message payload;
a means for formatting the frame header with a service region identifier, wherein the service region identifier is associated with a service region for a broadcast tower; encoding control information in the frame header, wherein the control information comprises at least one of: a broadcast condition associated with the service region for the broadcast tower, a change in available channels associated with the service region for the broadcast tower, an assignment of a particular channel for a particular client device, an assignment of another particular channel for all client devices, and a change counter that is arranged to indicate when a change has taken place in the system;
a means for encoding the transmission frame for valid reception by the at least one client device;
a means for scheduling a broadcast time for the transmission frame;
a means for transmitting the frame from the broadcast tower at the scheduled time for reception by the at least one client device;
a means for assembling a second transmission frame with a second frame header and the message payload;
a means for formatting the second frame header with a second service region identifier, wherein the second service region identifier is associated with a second service region for a second broadcast tower;
a means for transmitting the second frame from the second broadcast tower at a second scheduled time for reception by the client device, whereby the client device receives the message content in the service region and the second service region during a scheduled travel between the service region and the second service region.

16. The system of claim 15, further comprising a means for identifying a unique code associated with a particular client device, wherein the means for encoding is arranged to apply the identified unique code for each transmission that includes a personal message associated with the particular client device.

* * * * *